(12) United States Patent
Setoyama et al.

(10) Patent No.: US 6,196,155 B1
(45) Date of Patent: Mar. 6, 2001

(54) PLASMA PROCESSING APPARATUS AND METHOD OF CLEANING THE APPARATUS

(75) Inventors: Eiji Setoyama; Kouji Ishiguro, both of Hitachi; Hajime Murakami, Ibaraki; Hirofumi Seki, Hitachi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/290,169

(22) Filed: Apr. 13, 1999

(30) Foreign Application Priority Data

Apr. 15, 1998 (JP) .................................................. 10-104341

(51) Int. Cl.[7] .............................. C23C 16/00; H05H 1/00; B08B 6/00
(52) U.S. Cl. ........................ 118/723 MA; 118/723 MR; 118/723 I; 118/723 MW; 118/723 E; 156/345; 134/1.1
(58) Field of Search .................... 118/723 MR, 723 MA, 118/723 I, 723 E, 715, 723 MN; 156/345; 134/1.1, 22.1

(56) References Cited

U.S. PATENT DOCUMENTS 4,897,285 * 1/1990 Wilhelm ................................. 427/39
5,824,607 * 10/1998 Trow et al. .......................... 438/732
5,961,773 * 10/1999 Ichimura et al. .................... 156/345

FOREIGN PATENT DOCUMENTS 6-275600    9/1994   (JP) .
8-106994    4/1996   (JP) .
8-92748     4/1996   (JP) .

\* cited by examiner

*Primary Examiner*—Gregory Mills
*Assistant Examiner*—Parviz Hassanzadeh
(74) *Attorney, Agent, or Firm*—Mattingly, Stanger & Malur, P.C.

(57) ABSTRACT

A plasma processing apparatus comprises a plasma generating chamber including a side wall and a roof-plate to cover the upper part of the side wall, in which plasma is generated; a plurality of magnets, one group of the magnets being arranged on the roof-plate in concentric circles, with the polarity of each magnets in each circle being alternated, and the other group of the magnets being arranged around the side wall of the plasma generating chamber in rings, with the polarity of each magnet in each ring being alternated, to form a cusped magnetic field to confine the plasma in the plasma generating chamber; and a holding device which is provided in the plasma generating chamber, to hold a substrate to be processed with the plasma; wherein the magnet means arranged on the roof-plate and the magnet means arranged around the side wall are held in such a way that they can be moved up and down.

5 Claims, 2 Drawing Sheets

PLASMA PROCESSING APPARATUS AND METHOD OF CLEANING THE APPARATUS

BACKGROUND OF THE INVENTION

The present invention relates to a plasma processing apparatus and a method of cleaning the apparatus, and especially to a plasma processing apparatus for performing processes such as plasma etching, ion-doping, plasma-CVD film formation, sputtering film formation, and so on, which are used in the fabrication of semiconductor, and to a cleaning method for removing deposits adhering to the inside wall of the apparatus while the processes are performed.

A plasma processing apparatus used for fabricating semiconductor requires a high production rate, a high-speed fabrication of substrates, the ability to uniformly process a large-size substrate, and so forth. Many conventional techniques for a plasma processing apparatus to perform etching, CVD, etc., are disclosed in Japanese Patent Applications Laid-Open Hei 8-106994, Hei 8-92748, and Hei 6-275600. These techniques are devised to be used mainly for a CVD apparatus, and have features particular to a plasma-generation method of forming films and cleaning CVD apparatuses.

However, in all of the film formation and apparatus cleaning techniques, only the type of gas used is different: the plasma-generation and control methods are the same. Although the technique disclosed in Japanese Patent Application Laid-Open Hei 8-106994 can partially change the distribution of a magnetic field for generating plasma by changing the level of current flowing in magnet coils, deposits adhering to the inside of a plasma processing apparatus cannot be entirely removed, or places remain where the deposits have only slightly been removed, because the distribution of the magnetic field cannot be significantly changed. Further, while the technique disclosed in Japanese Patent Application Laid-Open Hei 8-92748 can clean the whole inside wall of a plasma processing apparatus, the cleaning speed is low, which is a bottleneck to the mass production of films, because the plasma enclosing ability is low near the inside wall. Furthermore, in Japanese Patent Application Laid-Open Hei 6-275600, there is a problem in which the low cleaning ability of the multi-cusped magnetic field generating means may actually cause contamination of the inside wall of a processing apparatus.

Recently, since the capacities of semiconductor memory cells have been hugely increased, and their patterns are also made very minute, the reduction of particles generated in plasma during the processing of semiconductor memory cells has become indispensable from a production yield point of view. Particles of the material from which a film is made adhere not only to the surface of a substrate but also to the substrate-electrode, the inside wall of the processing chamber, the internal systems, etc. These adhering particles of the material from which a film is made are further detached and float in the processing chamber due to the injection of gas, vacuum ventilation, heating/cooling, an electrical discharge to generate plasma, and so on. Further, these particles enter the formed film.

Therefore, the adhering particles are removed by cleaning the inside wall of the processing chamber between film formation processes, or after finishing a predetermined intermediate sequence of a film formation process. However, particles adhering to some places are only slightly removed due to effects of either a magnetic field generating plasma, or an electric field.

SUMMARY OF THE INVENTION

The present invention has been achieved in consideration of the above-described problems, and is aimed at providing both a plasma processing apparatus with a high production rate and a method of cleaning the inside of the apparatus which can perform uniform, efficient, and high-speed cleaning of the inside wall of a processing chamber after a film formation process is finished.

To attain the above object, the present invention provides a plasma processing apparatus comprising:

a plasma generating chamber in which plasma is generated; magnet means including a plurality of magnets which are arranged around the plasma generating chamber, with the polarity of each magnet being alternated, to form a cusped magnetic field to confine the plasma in the plasma generating chamber; and holding means which is provided in the plasma generating chamber, for holding a substrate to be processed with the plasma; wherein the magnet means is movably held such that it can move the formed cusped magnetic field.

Further, the present invention provides a plasma processing apparatus comprising:

a plasma generating chamber including a substantially cylindrical side wall and a roof-plate to cover the upper part of the side wall, in which plasma is generated; a plurality of magnets, one group of the magnets being arranged on the roof-plate in concentric circles, with the polarity of each magnet in each circle being alternated, and the other group of the magnets being arranged around the side wall of the plasma generating chamber in rings, with the polarity of each magnet in each ring being alternated, to form a cusped magnetic field to confine the plasma in the plasma generating chamber; and holding means which is provided in the plasma generating chamber, for holding a substrate to be processed with the plasma; wherein the magnet means arranged on the roof-plate and the magnet means arranged around the side wall are movably held such that they can be moved up and down.

Furthermore, in the above plasma processing apparatus, the group of the permanent magnets arranged on the roof-plate is supported by a moving mechanism which moves up and down, and the other group of the permanent magnets arranged around the side wall of the plasma generating chamber is supported by a swing mechanism to reciprocally move the other group of the permanent magnets up and down.

Moreover, the present invention provides a plasma processing apparatus comprising:

a plasma generating chamber including a substantially cylindrical side wall and a roof-plate to cover the upper part of the side wall, in which plasma is generated; a plurality of magnets, one group of the magnets being arranged on the roof-plate in concentric circles, with the polarity of each magnets in each circle being alternated, and the other group of the magnets being arranged around the side wall of the plasma generating chamber in rings, the polarity of each magnet in each ring being alternated, to form a cusped magnetic field to confine the plasma in the plasma generating chamber; and holding means which is provided in the plasma generating chamber, for holding a substrate to be processed with the plasma; wherein the group of the permanent magnets arranged on the roof-plate is rotatably held eccentric to the central axis of the plasma generating chamber, and the other group of the permanent magnets arranged around the side wall of the plasma generating chamber is movably held such that it can be moved up and down.

Also, the present invention provides a plasma processing apparatus comprising:

a plasma generating chamber including a substantially cylindrical side wall and a roof-plate to cover the upper part of the side wall, in which plasma is generated; a plurality of magnets, one group of the magnets being arranged on the roof-plate in concentric circles, with the polarity of each magnet in each circle being alternated, and the other group of the magnets being arranged around the side wall of the plasma generating chamber in rings, with the polarity of each magnet in each ring being alternated, to form a cusped magnetic field to confine the plasma in the plasma generating chamber; and holding means which is provided in the plasma generating chamber, for holding a substrate to be processed with the plasma; wherein the group of the permanent magnets arranged on the roof-plate are composed so that the magnetic field strength is alternately changed in the peripheral direction, with being rotatably held, and the other group of the permanent magnets arranged around the side wall of the plasma generating chamber is movably held such that it can be moved up and down.

Still further, the present invention provides a plasma processing apparatus comprising:

a microwave generating source; a vacuum chamber into which a microwave is introduced from the microwave generating source; a magnetic field generating coil for generating a magnetic field to generate plasma by using electron cyclotron resonance with the microwave: a plurality of permanent magnets arranged around the vacuum chamber with alternating polarities for each of the magnets, for confining the plasma; and holding means which is provided in the vacuum chamber, for holding a substrate to be processed with the plasma; wherein at least one of the magnetic field generating coil and the plurality of the permanent magnets is movably held such that it can be moved up and down.

Furthermore, the present invention provides a plasma processing apparatus comprising:

a vacuum chamber with a dome in the side wall of the chamber, a roof-plate being located on the upper part of the side wall; plasma inducing coils arranged around the side wall; and holding means which is provided in the vacuum chamber, for holding a substrate to be processed with the plasma generated by the plasma inducing coils; wherein a plurality of permanent magnets to confine the plasma is arranged outside the plasma inducing coils, with the polarity of each of the permanent magnets being alternated, and is movably held such that it can be moved.

On top of that, the present invention provides a method of cleaning the inside of a plasma processing chamber, comprising the steps of:

forming a cusped magnetic field with a plurality of permanent magnets arranged around the plasma processing chamber, with the polarity of each of the permanent magnets being alternated; confining plasma generated in the chamber with the cusped magnetic field; and removing deposits adhering to the inside wall of the chamber by moving the cusp points of the cusped magnetic field.

Also, the present invention provides a method of cleaning the inside of a plasma processing chamber, comprising the steps of:

forming a cusped magnetic field with a plurality of permanent magnets arranged around the plasma processing chamber, with the polarity of each of the permanent magnets being alternated; confining plasma generated in the chamber with the cusped magnetic field; and removing deposits adhering to the inside wall of the chamber by injecting ions in the plasma, while moving the cusp points of the cusped magnetic field, which contact the inside wall of the chamber.

In a typical cleaning process, the radicals and ions in the plasma in a processing chamber clean the inside of the chamber. But, if a cusped magnetic field is used to confine the plasma, the activity of the ions is lowered by the magnetic field. When a high-frequency bias is applied to the inside wall in the region of the cusped magnetic field that is confining the plasma, it can be seen that the cleaning speed at the intermediate point between cusp points is four times higher than that at the cusp points. Accordingly, in the present invention, a bias potential is applied to the inside wall of the processing chamber, and a plurality of plasma rings is generated in the chamber. By moving the positions of the magnets that confine the plasma rings—that is, moving the positions of the cusp points—, places that are cleaned at a low speed are then cleaned at a higher speed; and the uniform cleaning and high production rate of the plasma processing apparatus can be achieved. Thus, the object of the present invention is attained.

DETAILED DESCRIPTION OF THE EMBODIMENTS

Hereafter, details of the embodiments according to the present invention will be explained with reference to the drawings.

Figure 1:
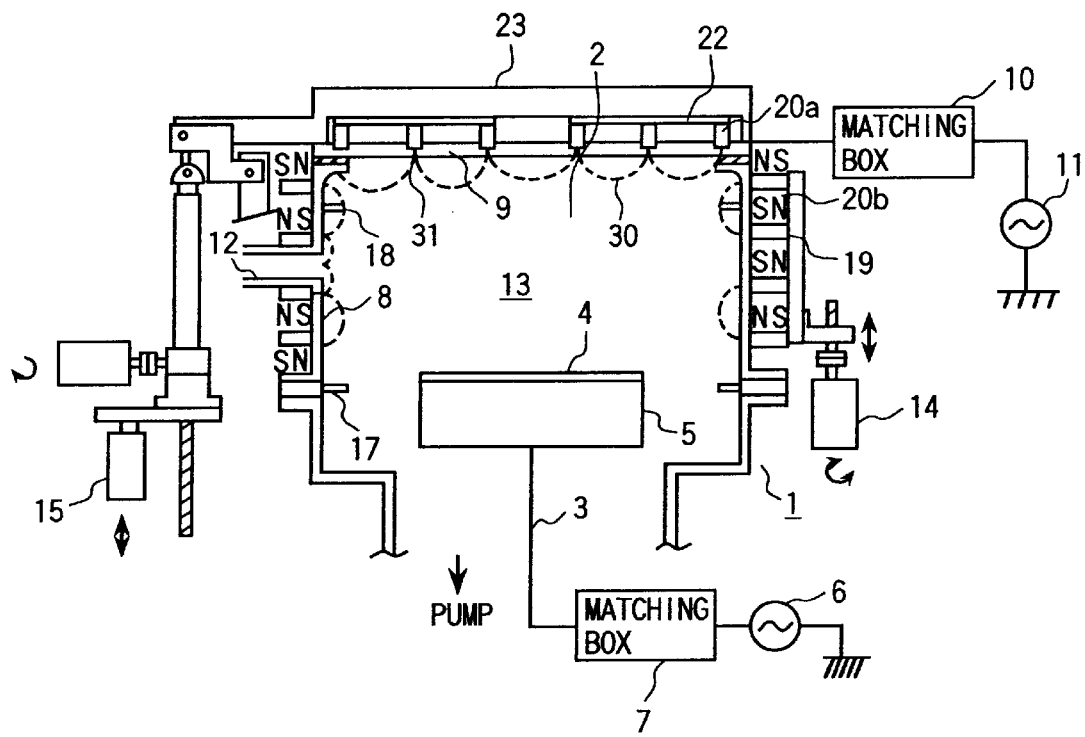
FIG. 1 is a vertical cross section showing the composition of a plasma processing apparatus of the first embodiment according to the present invention.

In the embodiment shown in FIG. 1, a plasma processing chamber 1 includes a processing chamber 2 to perform plasma processing and a ventilation unit 3 to expel internal gas from the processing chamber 2. A substrate-electrode 5 to hold a substrate 4 is provided in the lower part of the chamber 2, and a high-frequency bias power source 6 is connected to the substrate-electrode 5 via a matching box 7. Moreover, a roof-plate 9 is provided in the upper part of chamber 2, opposite to the substrate-electrode 5, and a high-frequency bias power source 11 is also connected to the roof-plate 9 via a matching box 10. This roof-plate 9 is insulated from the side wall 8 which, along with the roof-plate 9, forms the chamber 2, and from the ventilation unit 3 in the chamber 2. Also, a microwave guiding port 12 for guiding a microwave to generate the plasma source is provided at the side wall 8 of the chamber 2.

Furthermore, a plurality of permanent magnets 20a is arranged in concentric circles on the roof-plate 9 with the polarity of each permanent magnet being alternately reversed, and a plurality of permanent magnets 20b is also arranged in rings outside the side wall with the polarity of each permanent magnet again being alternately reversed. However, the polarity of each permanent magnet is made the same at the microwave guiding port 12 so that an electron cyclotron resonance (ECR) region to generate high-density plasma is locally formed. Groups of the permanent magnets 20a arranged on the roof-plate 9 and the permanent magnets 20b arranged around the side wall 8 are supported by swing mechanisms 15 and 14, respectively, which reciprocally move each of the groups up and down as a group, relative to the processing chamber 2. Regarding the group of the permanent magnets 20b arranged around the side wall 8, the permanent magnets 20b are supported by a yoke 19 at the side opposite to the chamber 2, and the torque of a motor converted by a mechanical system to generate a reciprocal motion is transferred to the yoke 19. Thus, the magnets 20b are reciprocally moved up and down as a group. On the other hand, the permanent magnets 20a arranged on the roof-plate 9 are reciprocally moved up and down by the cylinder mechanism (swing mechanism). More specifically, the permanent magnets 20a arranged in a manner of concentric circles on the roof-plate 9 are supported by a yoke 22 made of magnetic material (a combination of a yoke and a magnetic member) connected to a cover-plate 23 to protect the permanent magnets 20a on the side opposite to the chamber 2, and the cover-plate 23 is linked to the top of the cylinder mechanism, which is driven with an oil or air hydraulic system, a motor, etc. Here, the permanent magnets arranged near the microwave guiding port 12 are separated from the swing mechanism 14.

In the following, the operations and effects of the plasma processing apparatus of this embodiment will be explained.

With reference to FIG. 1, a microwave introduced into the processing chamber 2 by the microwave guiding port 12 causes the resonant excitation of gas in a region of the chamber 2 with a magnetic field strength higher than 875 G (the ECR critical condition), and the excited gas emits a large number of high-energy electrons in the chamber 2 which then diffuse in the chamber 2. Furthermore, there is discharge in the chamber 2 caused by the diffusing high-energy electrons and the high-frequency bias applied to the roof-plate 9, and plasma 13 is generated. Moreover, silane gas introduced from a gas inlet 17 and its radicals—that is,—active species of silane—react with the oxygen gas plasma, and the resultant substances of silicon dioxide are deposited on the substrate 4. At the same time, biased film-formation is performed by applying a high-frequency bias to the substrate-electrode 5 from the high-frequency bias power source 6, while etching the surface of the substrate 4.

These resultant substances of silicon dioxide are deposited not only on the surface of the substrate 4 but also on many other places, such as the inside surface of the processing chamber 2, the sides of the substrate-electrode 5, the gas inlet 17, the gas inlet 18, the microwave guiding port 12, and so on. Since these deposits contaminate the inside of the chamber 2, and also cause the generation of undesirable particles, cleaning with discharge-plasma is usually carried out to remove the resultant deposits of silicon dioxide. In the cleaning process, fluorine gas is introduced into the chamber 2 to generate fluorine plasma, and fluoride gas is generated by a reaction of the resultant deposits, the fluorine plasma, and its radicals. Lastly, the fluoride gas is expelled from the chamber 2.

However, since ions in the plasma only slightly enter the cusped magnetic field which is used to efficiently confine the plasma for film formation and to easily maintain the density of the plasma, and are then reflected by the cusped magnetic field, only fluorine-radicals react with the deposits. On the other hand, a magnetic field parallel to the inside wall of the chamber 2 is generated in the interval between the cusp points, and electrons are accelerated and turned in a direction perpendicular to the magnetic field by the potential difference between the plasma along the inside wall and the electron, and the magnetic field. Further, the accelerated electrons collide with molecules of the internal gas, and ionize this gas. Furthermore, the generated ions are accelerated and forced onto the inside wall by the potential difference between the inside wall and the ions (the negative potential should be applied to the inside wall in order to accelerate the ions, and a high-frequency bias can be used). Therefore, the deposit film of silicon dioxide can be etched about four times faster occurrence at the intermediate region than near the cusp points 31 where the deposits are etched only by radical-reactions.

Thus, in this embodiment, the permanent magnets 20a arranged on the roof-plate 9 to generate the cusped magnetic field used for cleaning with the plasma are reciprocally moved up and down by the swing mechanism 15, and the permanent magnets 20b arranged around the inside wall 8 are also reciprocally moved up and down by the swing mechanism 14. The swing mechanism 15 to reciprocally move the permanent magnets 20a up and down can lift the magnets 20a upward by about 10–20 mm with a cylinder mechanism. Since the permanent magnets 20a are arranged in concentric circles on the roof-plate 9, concentric plasma rings are formed in the chamber 2, and the deposits near cusp lines—each line being a string of cusp points 31—are only slightly etched by the plasma. However, by lifting the magnets 20a from the roof-plate 9 with the swing mechanism 15 of this embodiment during the cleaning process, the strength of the cusped magnetic field 30 is reduced, and both the forcing of ions (plasma) onto the inside wall of the roof-plate 9 and the etching of the inside wall are enhanced, which can result in efficient etching of the inside wall of the roof-plate 9. On the other hand, on the side wall 8 of the chamber, by reciprocally moving the magnets 20a up and down along the side wall 8 with the swing mechanism 14 of this embodiment during the cleaning process, cusp lines composed of strings of cusp points 31 are lifted and lowered, the etching speed on the side wall 8 is smoothed, which can increase the average etching speed over the whole side wall 8, and therefore result in efficient etching of the side wall 8.

Figure 2:
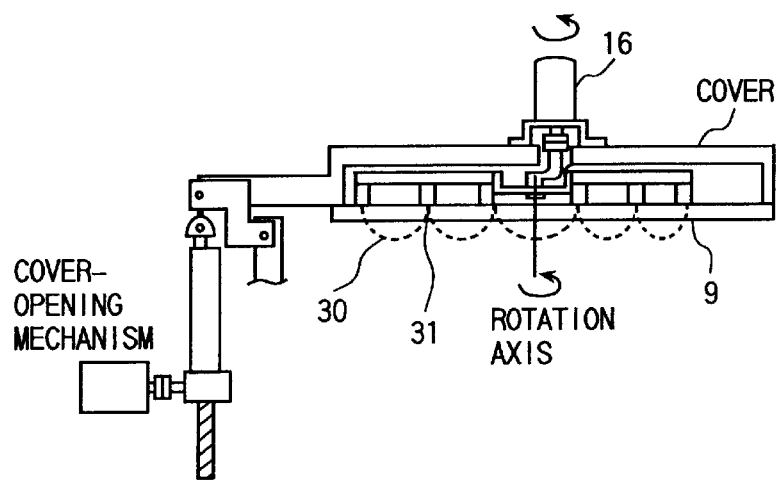
FIG. 2 is a vertical cross section showing the composition of a plasma processing apparatus of the second embodiment according to the present invention.

FIG. 2 shows a vertical cross section of a plasma processing apparatus of a second embodiment according to the present invention. In this figure, only parts different from those shown in FIG. 1 are shown. In this embodiment, the plurality of permanent magnets 20a arranged in concentric circles are instead placed on the roof-plate 9 eccentric to the central axis of the processing chamber 2, and rotated by a rotation mechanism 16 such as a motor.

According to this embodiment, since the magnets 20a are eccentrically rotated by the rotation mechanism 16, and the locations of the cusp lines for the strings of cusp points 31 are not fixed on the inside wall of the roof-plate 9, the etching speed on the inside wall of the roof-plate 9 is averaged, which can increase the average etching speed over the whole inside wall, and therefore result in efficient etching of the inside wall of the roof-plate 9. In an example not shown in a figure, the magnetic field strength in each ring of the permanent magnets 20a arranged on the roof-plate 9 is alternately changed in the peripheral direction, and the plurality of the magnets 20a arranged in rings are rotated as a group, which can also average the etching speed for the inside of the chamber 2. Here, since the cleaning method for the side wall 8 is the same as that shown in FIG. 1, an explanation of the cleaning method is omitted.

Figure 3:
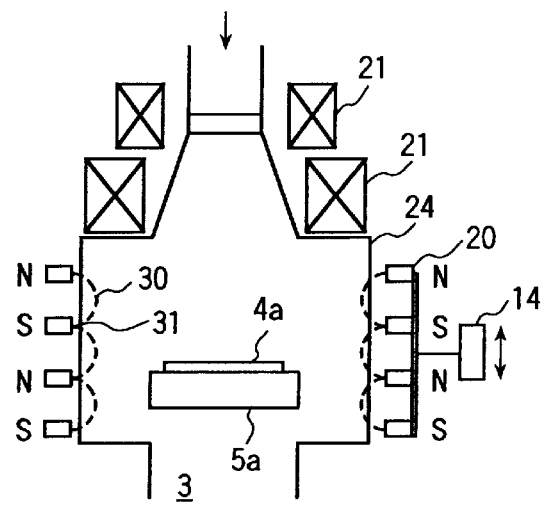
FIG. 3 is a vertical cross section showing the composition of a plasma processing apparatus of the third embodiment according to the present invention.

FIG. 3 is a vertical cross section showing the composition of a plasma processing apparatus of a third embodiment according to the present invention. The plasma processing apparatus of this embodiment includes a vacuum chamber 24 into which a microwave is sent from a microwave generator (not shown in this figure), magnetic field generating coils 21 arranged around the vacuum chamber 24 to form a magnetic field to generate plasma by causing electron cyclotron resonance with the microwave, a plurality of permanent magnets 20 arranged around the vacuum chamber 24 with alternating polarities, and a substrate-electrode 5a on which a substrate 4a to be processed with the plasma confined by the magnets 20 is held. Further, in this embodiment, the magnets 20 arranged around the vacuum chamber are supported as a group, and reciprocally moved up and down by a swing mechanism 14a. The cleaning effects of the plasma processing apparatus of this embodiment are equal to those of the apparatuses of the above-mentioned embodiments.

Here, if a strong magnetic field is formed in the vacuum chamber 24, ions of the plasma generated in the chamber 24 are prevented by the strong magnetic field from reaching the inside wall of the chamber 24 to which the deposits adhere sufficient to clean the inside wall, which lowers the cleaning speed, and generate dust particles. Therefore, it is effective in reciprocally moving the coils 21 to generate the magnetic field necessary to confine the plasma up and down or in changing the magnetic field strength of some of the magnets 21, in order to reduce the number of places into which small numbers of ions may enter. However, the magnets 21 are very heavy, and a large lifting/lowering mechanism is necessary to reciprocally move the magnets 21 up and down, which greatly increases the scale of the plasma processing apparatus. Thus, during the cleaning, it is preferable that the plasma be confined by the magnetic field formed by the permanent magnets 20 without exciting the coils 21, and the magnets 20 is reciprocally moved up and down by the swing mechanism 14 as mentioned above.

Figure 4A:
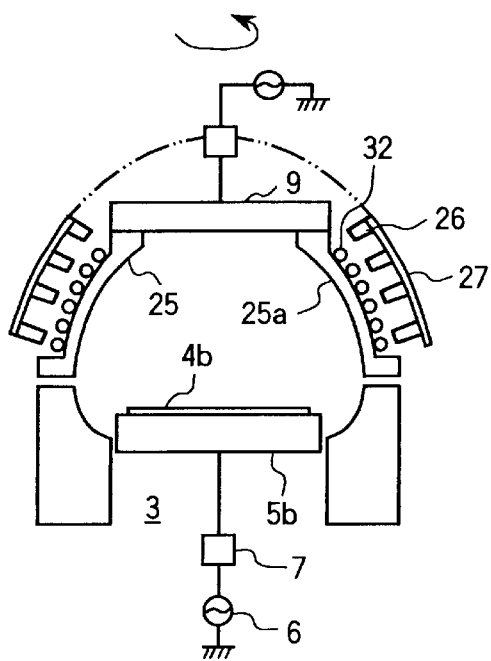
FIG. 4A is a vertical cross section showing the composition of a plasma processing apparatus of the fourth embodiment according to the present invention.
Figure 4B:
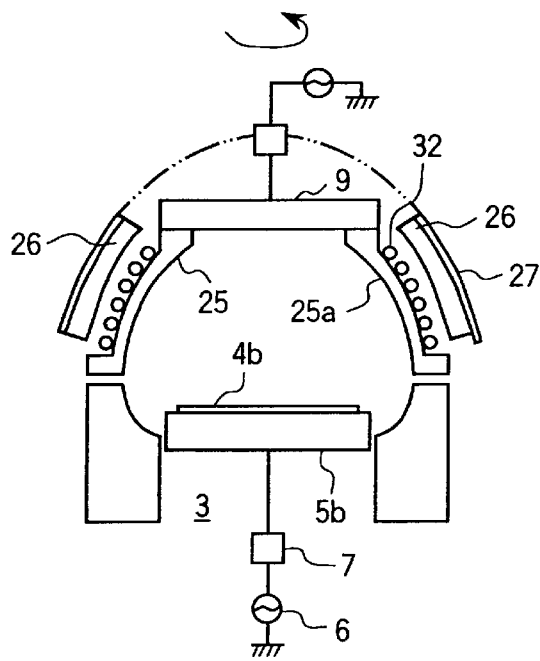
FIG. 4B is a vertical cross section showing the composition of an improved example of the plasma processing apparatus shown in FIG. 4A.

FIG. 4A shows a vertical cross section of a plasma processing apparatus of a fourth embodiment according to the present invention. In the plasma processing apparatus of this embodiment, induction coils 32 are provided outside a vacuum chamber 25, and plasma is induced by a high-frequency induction method using the induction coils 32.

As shown in FIG. 4A, the side wall 25a is not cylindrical, as shown in the above embodiments, but domed, and the roof-plate 9 is provided on the upper portion of the side wall 25a, to which a high-frequency bias is applied. Moreover, the coils 32 for inducing plasma in the vacuum chamber 25 are arranged around the vacuum chamber 25. When the resultant substances adhering to the inside of the vacuum chamber are cleaned off, it is necessary to pass a high-frequency current through the coils 32, so as to maintain the plasma. Ions of the plasma induced by the coils 32 through which the high-frequency current is passing moves along the magnetic flux generated by the coils 32. Accordingly, active collisions of the ions with the side wall 25a do not occur, and the cleaning speed is low.

Thus, in this embodiment, plasma is confined by a magnet means 27 in which a plurality of permanent magnets 26 are arranged, and the resultant substances adhering to the inside surface of the side wall 25a are uniformly removed by moving a ring of the plasma up and down in a reciprocating motion, or by rotating the magnet means 27.

Although it is most effective to form the ring of plasma by arranging the permanent magnets 26 parallel to the top face of the substrate 4b, it happens that when the magnets 26 are moved up and down, this arrangement makes it difficult to confine the plasma because of the departure of the magnetic field from the side wall 25a, which is due to the domed shape of the side wall 25a. Accordingly, the permanent magnets 26 are arranged perpendicular to the top face of the substrate 4b around the side wall 25a, and plasma bars in place of the plasma rings are formed along the inside surface of the side wall 25a. Further, by swinging or rotating the plasma bars, more uniform cleaning can be accomplished. Alternately changing the magnetic field strength of the permanent magnets 26 in the peripheral direction causes similar cleaning effects.

Although cleaning methods for a plasma CVD apparatus are explained in the above embodiments, the above-mentioned cleaning methods can further be applied to a plasma etching apparatus, a plasma sputtering apparatus, and so forth.

According to the plasma processing apparatus and the cleaning method of the present invention, the spatial inconsistency in the cleaning speed after the completion of film formation can be averaged by moving the cusp locations, which improves both the speed and efficiency of the cleaning, and increases the production rate of the plasma processing apparatus.

What is claimed is:

1. A plasma processing apparatus comprising:
a plasma generating chamber including a substantially cylindrical side wall and a roof-plate to cover the upper part of said side wall, in which plasma is generated;
a plurality of magnets, one group of said magnets being arranged on said roof-plate in concentric circles, with the polarity of each magnets in each circle being alternated, and the other group of said magnets being arranged around said side wall of said plasma generating chamber in rings, the polarity of each magnet in each ring being alternated, to form a cusped magnetic field to confine said plasma in said plasma generating chamber; and
holding means which is provided in said plasma generating chamber, for holding a substrate to be processed with said plasma;
wherein said group of said permanent magnets arranged on said roof-plate is rotatably held eccentric to the central axis of said plasma generating chamber, and said other group of said permanent magnets arranged around said side wall of said plasma generating chamber is movably held such that it can be moved up and down.

2. A plasma processing apparatus comprising:
a plasma generating chamber including a substantially cylindrical side wall and a roof-plate to cover the upper part of said side wall, in which plasma is generated;
a plurality of magnets, one group of said magnets being arranged on said roof-plate in concentric circles, with the polarity of each magnet in each circle being alternated, and the other group of said magnets being arranged around said side wall of said plasma generating chamber in rings, with the polarity of each magnet in each ring being alternated, to form a cusped magnetic field to confine said plasma in said plasma generating chamber; and holding means which is provided in said plasma generating chamber, for holding a substrate to be processed with said plasma;

wherein said group of said permanent magnets arranged on said roof-plate are composed so that the magnetic field strength is alternately changed in the peripheral direction, with being rotatably held, and said other group of said permanent magnets arranged around said side wall of said plasma generating chamber is movably held such that it can be moved up and down.

3. A plasma processing apparatus comprising:

a microwave generating source;

a vacuum chamber into which a microwave is introduced from said microwave generating source;

a magnetic field generating coil for generating a magnetic field to generate plasma by using electron cyclotron resonance with said microwave:

a plurality of permanent magnets arranged around said vacuum chamber with alternating polarities for each of said magnets, for confining said plasma; and holding means which is provided in said vacuum chamber, for holding a substrate to be processed with said plasma;

wherein at least one of said magnetic field generating coil and said plurality of said permanent magnets is movably held such that it can be moved up and down.

4. A plasma processing apparatus comprising:

a vacuum chamber with a dome in the side wall of said chamber, a roof-plate being located on the upper part of said side wall;

plasma inducing coils arranged around said side wall; and holding means which is provided in said vacuum chamber, for holding a substrate to be processed with said plasma generated by said plasma inducing coils;

wherein a plurality of permanent magnets to confine said plasma is arranged outside said plasma inducing coils, with the polarity of each of said permanent magnets being alternated, and is movably held such that it can be moved, and wherein said plurality of permanent magnets is supported by a swing mechanism which performs one of a drive function for reciprocatingly moving said permanent magnets up and down and a drive function for rotating said permanent magnets.

5. A plasma processing apparatus comprising:

a plasma generating chamber including a substantially cylindrical side wall and a roof-plate to cover the upper part of said side wall, in which plasma is generated;

a plurality of magnets, one group of said magnets being arranged on said roof-plate in concentric circles, with the polarity of each magnet in each circle being alternated, and the other group of said magnets being arranged around said side wall of said plasma generating chamber in rings, with the polarity of each magnet in each ring being alternated, to form a cusped magnetic field to confine said plasma in said plasma generating chamber; and holding means which is provided in said plasma generating chamber, for holding a substrate to be processed with said plasma;

wherein said one group of magnets arranged on said roof-plate and said other group of magnets arranged around said side wall are movably held to be moved up and down, and wherein said one group of magnets arranged on said roof-plate is supported by a moving mechanism which moves up and down, and said other group of magnets arranged around said side wall of said plasma generating chamber is supported by a swing mechanism that reciprocally moves said other group of magnets up and down.

\* \* \* \* \*